(12) United States Patent
Bel et al.

(10) Patent No.: US 7,119,284 B2
(45) Date of Patent: Oct. 10, 2006

(54) PRINTED CIRCUIT BOARD WITH ISOLATED METALLIC SUBSTRATE COMPRISING AN INTEGRATED COOLING SYSTEM

(75) Inventors: Carles Borrego Bel, Tarragon Valls (ES); Xavier Sanchez Foguet, Tarragon Valls (ES); Alex Subirates Sole, Tarragon Valls (ES)

(73) Assignee: Lear Corporation, Southfield, MI (US)

( * ) Notice: Subject to any disclaimer, the term of this patent is extended or adjusted under 35 U.S.C. 154(b) by 318 days.

(21) Appl. No.: 10/707,634

(22) Filed: Dec. 26, 2003
(Under 37 CFR 1.47)

(65) Prior Publication Data

US 2004/0188132 A1     Sep. 30, 2004

(51) Int. Cl.
*H05K 1/00* (2006.01)
(52) U.S. Cl. ............... 174/252; 62/259.2; 165/80
(58) Field of Classification Search ........... 174/252; 62/259.2; 165/80.4
See application file for complete search history.

(56) References Cited

U.S. PATENT DOCUMENTS 5,875,097 A    2/1999  Amaro et al. ............. 361/704
5,929,518 A *  7/1999  Schlaiss ..................... 257/712
6,032,355 A    3/2000  Tseng et al. ................. 29/840
6,158,232 A * 12/2000  Tsuji et al. ................ 62/259.2
6,190,941 B1   2/2001  Heinz et al. ............... 438/106
6,201,300 B1   3/2001  Tseng et al. .............. 257/706
6,201,701 B1   3/2001  Linden et al. ............. 361/720
6,212,071 B1   4/2001  Roessler et al. ........... 361/704
6,219,246 B1   4/2001  Edevold et al. ........... 361/707
6,226,178 B1   5/2001  Border et al. ............. 361/687

* cited by examiner

*Primary Examiner*—Kamand Cureo
*Assistant Examiner*—Ivan Carpio
(74) *Attorney, Agent, or Firm*—Bruce E. Harang

(57) ABSTRACT

Printed circuit board with insulated metal substrate with integrated cooling systemlt comprises a metal substrate (10), at least one electrically insulating layer (11) adhered to said metal substrate (10) and several electro-conducting tracks (12) capable of interconnecting electronic power components (24), adhered to said electrically insulating layer (11), said metal substrate (10) incorporating several heat transporting channels comprising several conduits for a heat-carrying fluid, conduits which extend to the outside of the metal substrate up to a heat transfer area to an outside medium.

10 Claims, 2 Drawing Sheets

PRINTED CIRCUIT BOARD WITH ISOLATED METALLIC SUBSTRATE COMPRISING AN INTEGRATED COOLING SYSTEM

BACKGROUND OF INVENTION

1. Scope of the Invention

The present invention refers to a printed circuit board with insulated metal substrate with an integrated cooling system, said cooling system comprising one or more conduits for a heat-carrying fluid.

2. Technical Background

In printed circuit boards interconnecting electric and electronic power components, there is a drawback related to the dissipation or elimination of heat generated by such components. The use of dissipators or heat sinks is well known in the state of the art, which consist of elements of a highly heat conductive material thermally connected, either directly or indirectly, to the heat generating components or to a support substrate thereof and provided with a large surface area, frequently formed by fins, in contact with the circulating medium. Patents U.S. Pat. No. 5,875,097 and U.S. Pat. No. 6,219,246 disclose embodiment examples of such heat sinks, and patent U.S. Pat. No. 6,181,556 discloses an apparatus for electronic device heat dissipation composed of a combination of heat sinks provided with fins, arranged so as to encircle the component to be cooled and thermally connected together by means of thermal bridge elements, said heat sinks being submitted to an airflow generated by several fans.

The use of heat pipes is also known for keeping an electronic circuit component at a suitable working temperature. A heat pipe comprises a span of pipe closed on its ends and partially full of heat-carrying fluid, said pipe comprising at least one evaporation region located close to or in contact with the heat source and at least one condensation region, for example, exposed to the circulating air. Patent U.S. Pat No. 6,226,178 discloses a laptop computer in which a heat pipe has an evaporation region in contact with a heat generating microprocessor and two separate condensation regions connected to several respective different heat dissipating devices, one of them consisting of a heat sink with forced ventilation and the other consisting of an extensive passive heat dissipation board located behind the display. A drawback of this system is that the evaporation region is in contact with the single component or with an auxiliary board on which the component is assembled, but it does not cool the entire printed circuit board on which a plurality of heat generating components are assembled.

Patent U.S. Pat. No. 6,212,071 uses several tracks of a heat conducting material embedded on the substrate of a conventional printed circuit board and thermally connected on one end to those areas or components of the board where heat is generated and, on the other end, on the edge of the substrate, to several external dissipators, such as a metal casing encircling the board. These heat conducting tracks can be formed in a manner that is analogous to the electro-conducting tracks on a multi-layer board, in which case they would be of copper. They can also be formed by drilling several holes from the edge of the board and filling said holes with a melted metallic material, such as welding material. However, both the copper tracks or channels and those of the welding material are costly to manufacture and they have a relatively low heat dissipation yield. Said patent U.S. Pat. No. 6,212,071 suggests that conventional heat pipes can be used, but no construction or assembly details are given, no illustration on the arrangement thereof is claimed or provided.

Patents U.S. Pat. No. 6,190,941, U.S. Pat. No. 6,032,355 and U.S. Pat. No. 6,201,300 disclose various other forms of providing heat conduction paths through a substrate on a printed circuit board for dissipating heat generated by several components.

A technology that gives way to providing a high degree of heat dissipation to the support board of the components of a circuit is the printed circuit board with insulated metal substrate technology, commonly referred to in the sector as IMS. A typical printed circuit board with insulated metal substrate comprises at least one metal support substrate, generally of an aluminum alloy, on which the electro-conducting circuit tracks, generally copper, are adhered by means of a layer of electrically insulating material which is the best possible heat conductor. With this arrangement, part of the heat generated by the components is dissipated through the metal substrate, which acts like a heat sink. However, in power applications such as a control and distribution box in an automobile, the heat dissipation provided by the insulated metal substrate technology is not enough to ensure that a deterioration or malfunction of the circuit does not occur due to thermal fatigue.

Work has recently been done for improving effectiveness in terms of heat dissipation on printed circuit boards with insulated metal substrate. Patent U.S. Pat. No. 6,201,701 discloses a multi-layer structure of power and control component connection tracks, assembled on a thick insulated metal substrate. The multiple electro-conducting layers are separated by layers of electrically insulating material and between them heat communication paths are arranged which improve the heat dissipation efficiency. However, heat transmission is produced from the components and the electro-conducting tracks to the metal substrate, but no improvements are provided in terms heat evacuation from the metal substrate.

Therefore, there is still a need for a more effective, compact and economical cooling system for effectively dissipating the heat generated by electronic components, especially components submitted to intense regimens, printed circuit boards with insulated metal substrate in power applications, such as a control and distribution box in an automotive vehicle.

BRIEF EXPLANATION OF THE INVENTION

The object of the present invention is to provide a printed circuit board with insulated metal substrate provided with a cooling system including one or more conduits for a heat-carrying fluid.

According to the present invention, this objective is reached by providing a printed circuit board with insulated metal substrate that incorporates or is in close contact with several conduits for said heat-carrying fluid, conduits which are extended outside of the metal substrate to a heat transfer area to an external medium. According to an embodiment example, said conduits are cavities formed on the metal substrate placed in a direction that is substantially parallel to said electrically insulating layer. At least one of the ends of each one of said cavities comes into an opening placed on an edge of the metal substrate. These openings are susceptible to coupling with several conduits of said heat-carrying fluid which are extended until said heat transfer area. Thus, the metal substrate material itself constitutes the conduit walls. In exchange, according to another embodiment example, said conduits are conduits for said heat-carrying fluid placed in close contact with the walls of several cavities formed on the metal substrate material in a direction that is substantially parallel to said electrically insulating layer. In this case, said conduits protrude at least on one edge of the metal substrate and extend on an external portion up to said heat transfer area.

In both embodiment examples, the cavities can be obtained by simply drilling the metal substrate. However, a more cost-effective form consists of providing said metal substrate formed by two layers joined together. This permits the cavities to be constituted of the juxtaposition of two semi-cavities respectively formed on each one of the metal substrate layers.

The second embodiment example mentioned above has the advantage of permitting easily obtaining the substrate by extrusion. For this, said cavities are parallel to each other and have a longitudinal opening all along its extension which opens on one side of the metal substrate, opposite the side thereof on which said electrically insulating layer and electro-conducting tracks are fixed. Therefore, the cross section of the metal substrate has an open profile shape suitable for being easily obtained by extrusion by means of a single tier.

In either of the two embodiment examples, said conduits for said heat-carrying fluid can be several known heat pipes, which are closed on both ends and partially full of said heat-carrying fluid, having an evaporation region inside of the metal substrate and an external condensation region extending a distance outside of it and which is in contact with the circulating air. In another heat exchange form, said conduits for said heat-carrying fluid are connected to a closed circuit piping including a passage through said heat exchange area. In cases in which the board is assembled in a vehicle, for example, forming part of a control and distribution box in an automobile, a span of said piping of said closed circuit can be in close contact with the material of the frame or body of a vehicle for aiding in heat dissipation through the same.

These and other advantages and features of the invention will become more clearly evident from the following detailed description of several embodiment examples thereof, which have a merely illustrative character, which in no case should be interpreted as limiting of the scope of the invention.

BRIEF DESCRIPTION OF DRAWINGS

Said detailed description is carried out in reference to the attached drawings in which.

DETAILED DESCRIPTION

Figure 1:
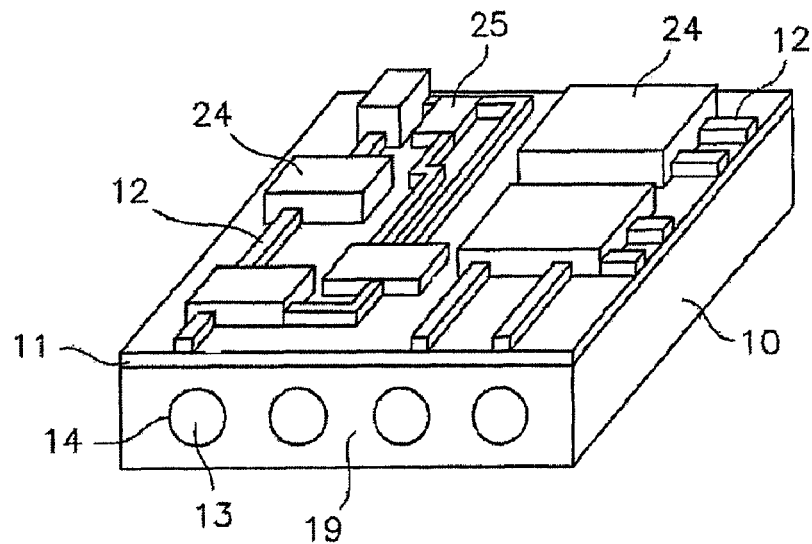
FIG. 1 shows a schematic perspective view of a printed circuit board with insulated substrate material with several cavities prepared for implementing the cooling system of the present invention.

First in reference to FIG. 1, it shows a printed circuit board with insulated metal substrate with the integrated cooling system according to the present invention. The printed circuit board shown in FIG. 1 is of the simplest type and comprises a metal substrate 10, on which an electrically insulating layer 11 is adhered and several electro-conducting tracks 12 adhered to said electrically insulating layer 11. These tracks connect electronic power components 24 together, or a combination of power 24 and control 25 components, at least some of which are highly heat generating and they need to be cooled in order to keep them at a suitable temperature for functioning. Said electro-conducting tracks 12 are generally obtained from a metal layer adhered to the insulating layer 11 selectively eliminated by means of a formation process such as etching. The material of the insulating layer 11 is selected such that, being electrically insulating, it is the best possible heat conductor. Thus, a large part of the heat generated by the components 24 is transferred to the metal substrate 10, which is typically of an aluminum alloy. The metal substrate 10 incorporates or is in close contact with several heat conduit channels comprising several conduits for a heat-carrying fluid extending outside of the metal substrate up to a heat transfer area to an external medium.

For this, the metal substrate 10 comprises several cavities 13 placed in a direction that is substantially parallel to said electrically insulating layer 11. At least one of the ends of each one of said cavities 13 comes into an opening 14 placed on at least one edge 19 of the metal substrate 10. Said cavities 13 are preferably through cavities with a circular or polygonal cross section, therefore they have openings 14 on their two ends arranged on different opposing edges 19 of the metal substrate 10. Different ways of obtaining said cavities are explained below in relation to FIGS. 4 and 5.

Figure 2:
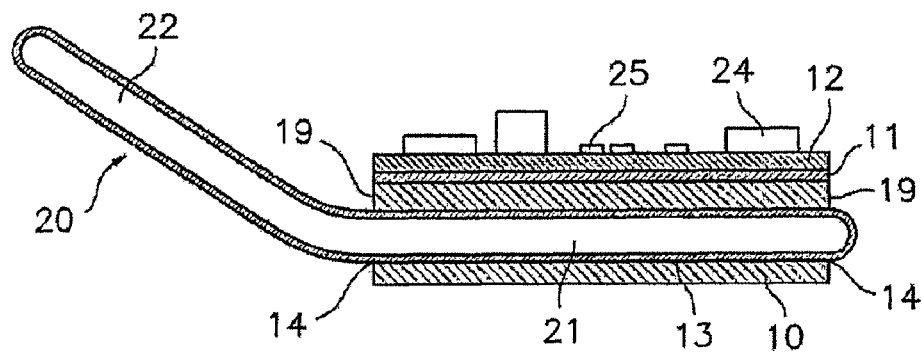
FIG. 2 shows a cross section view of an embodiment example of the present invention.

FIG. 2 shows an embodiment example of the invention in which said conduits are several conduits of said heat-carrying fluid in close contact with the walls of said cavities 13. Said conduits are advantageously heat pipes 20 which are closed on both ends and partially full of said heat-carrying fluid, with an evaporation region 21 inside of the metal substrate 10, and an external condensation region 22, extending a distance outside of the metal substrate 10 and which is in contact with the circulating air. This condensation region 22 can include several fins (not shown) or be in contact with a heat dissipation surface. The condensed fluid returns to the evaporation area by capillarity and gravity through the inner walls of the pipe, said region 22 is therefore inclined, according to that shown in the figure. The repeated evaporation-condensation cycles of the heat-carrying fluid extract heat from the metal substrate 10 and transfer it to the circulating air.

Figure 3:
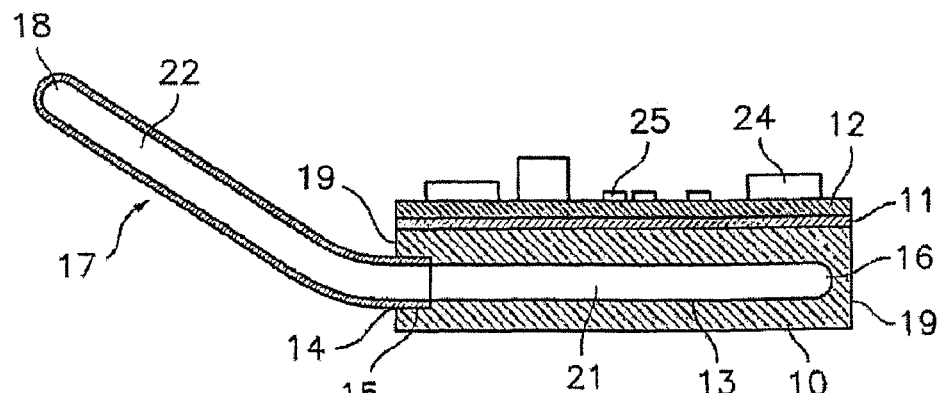
FIG. 3 shows a cross section view of another embodiment example of the present invention.

FIG. 3 shows another embodiment example in which the walls of the cavities 13 act as part of the conduits for the heat-carrying fluid. For this, each one of the cavities 13 has a blind end 16 while it has an opening 14 on only one of the edges 19 of the metal substrate 10. Said opening 14 is coupled with a span of pipe 17 provided with a blind distal end 18. Thus, the cavity 13 and pipe 17 assembly constitutes a heat pipe in which the cavity 13 performs the functions of the evaporation region 21 and the span of pipe 17 of the condensation region 22 in contact with the circulating air. The openings 14 preferably have a countersink opening 15 for receiving the ends of the respective spans of pipe 17.

Figure 4:
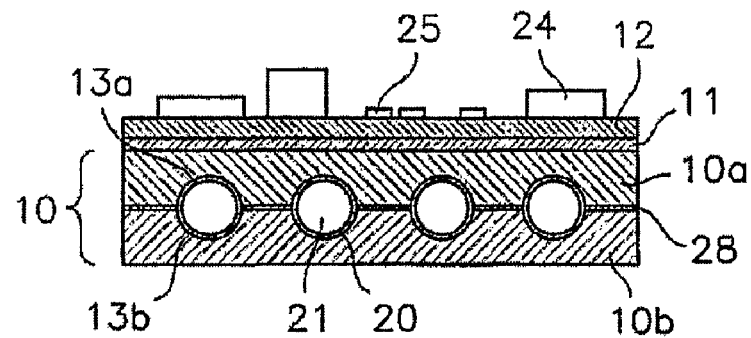
FIGS. 4 and 5 show cross section views showing different ways of carrying out said cavities.
Figure 5:
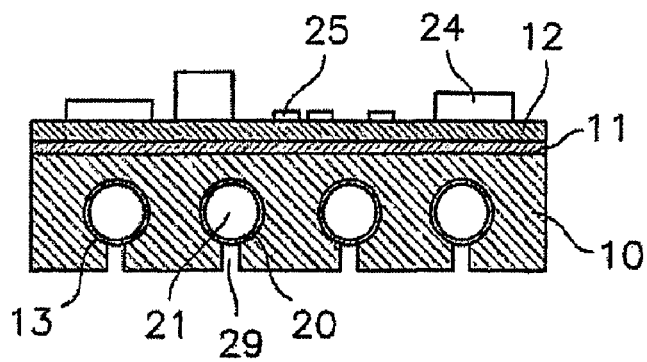

Now in reference to FIGS. 4 and 5, they show a cross section of two different ways of carrying out said cavities 13.

In the variant in FIG. 4, the metal substrate 10 is formed by two layers 10a, 10b joined together, for example by means of an adhesive layer 28 or by welding. Each one of the cavities 13 is formed by the juxtaposition of two semi-cavities 13a, 13b respectively formed on each one of the layers 10a, 10b of the metal substrate 10. If the cavities 13 have the shape of parallel through holes, the semi-cavities 13a, 13b adopt the shape of parallel slits formed on the corresponding surfaces of layers 10a, 10b of the metal substrate 10 and can be easily obtained by extrusion, by machining or by molding. This embodiment form is likewise compatible with the implementation of heat pipes 20 in close contact with the walls of the cavities 13 according to the embodiment example in FIG. 2 and with the use of said walls of the cavities 13 as part of the heat pipes 17 according to the embodiment example in FIG. 3, although for this latter case, obtaining the semi-cavities 13a, 13b by extrusion would not be possible.

In the variant in FIG. 5, the cavities 13 are parallel to each other and they have a longitudinal opening 29 along their entire extension which opens on a side of the metal substrate 10 opposite the side thereof on which said electrically insulating layer 11 and electro-conducting tracks 12 are fixed, such that the metal substrate 10 has an open cross section profile shape that is very suitable for being easily obtained by extrusion. However, this embodiment form only admits the implementation of heat pipes 20 in close contact with the walls of the cavities 13, according to the embodiment example in FIG. 2.

Figure 6:
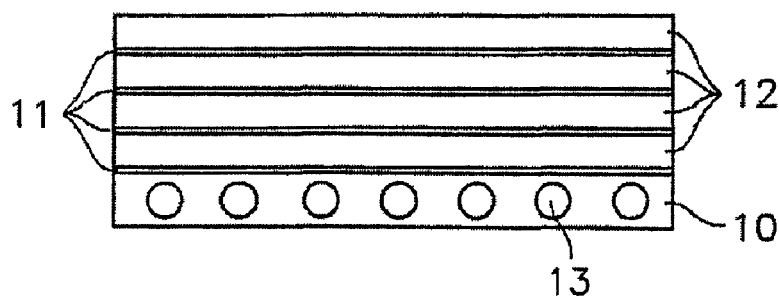
FIGS. 6 and 7 are cross section views of different types of printed circuit boards with insulated metal substrate on which the present invention has been implemented.
Figure 7:
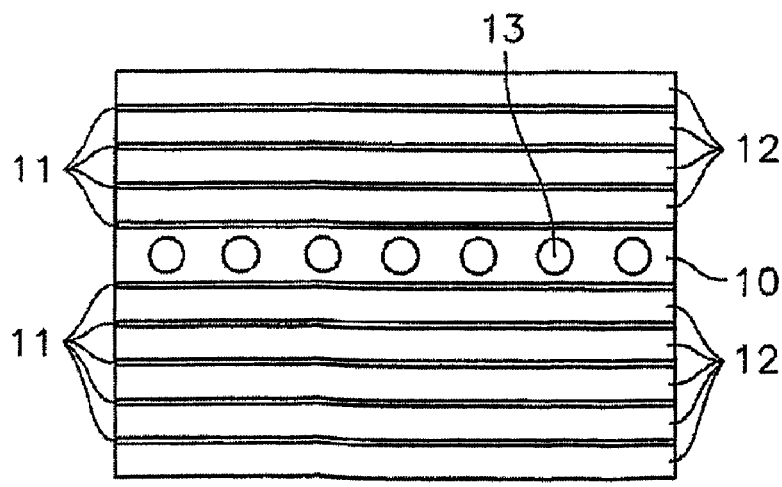

FIGS. 6 and 7 show different types of printed circuit boards with insulated metal substrate prepared for receiving the cooling system of the present invention.

The printed circuit board in FIG. 6 comprises a metal substrate 10 on a side of which multiple alternating layers of electrically insulating material 11 and electro-conducting tracks 12 are arranged. The printed circuit board in FIG. 7 comprises a metal substrate 10 on both sides of which multiple alternating layers of electrically insulating material 11 and electro-conducting tracks 12 are arranged. In the printed circuit board in FIG. 6 as well as the one in FIG. 7, the metal substrate 10 is provided with the cavities 13 ready to house any of the conduit variants for a heat-carrying fluid of the present invention according to what has been described above.

A skilled person in the art may contribute multiple variants without changing the object of the present invention, whose scope is defined by the attached claims.

The invention claimed is:

1. A printed circuit board having an insulated metal substrate with an integrated cooling system, comprising: a metal substrate(10); at least one electrically insulating layer (11) adhered to said metal substrate (10); and several electro-conducting tracks (12) capable of interconnecting electronic power components (24) adhered to said electrically insulating layer (11); wherein said metal substrate (10) incorporates at least one heat transporting cavity (13), having at least one opening (14) at one edge (19) of said metal substrate (10), said at least one heat transporting cavity (13) having located therein a conduit for a heat-carrying fluid, said conduits extending by way of said at least one opening (14) to the outside of, and upward from, said metal substrate (10) forming a sealed heat transfer area in an external heat transfer medium.

2. A printed circuit board according to claim 1, characterized in that said heat-carrying fluid conduits are heat pipes (20) that are closed on both ends and partially full of heat-carrying fluid, with an evaporation region (21) inside of the metal substrate (10) and an external condensation region (22) extending with an inclination a distance outside of the metal substrate (10) and which is in contact with an external heat transfer medium comprising circulating air.

3. A printed circuit board according to claim 1, characterized in that said at least one cavity (13) is a through cavity.

4. A printed circuit board according to claim 1, characterized in that said conduits comprise a plurality of cavities (13) all positioned in a direction that is substantially parallel to said electrically insulating layer (11), at least one of the ends of each one of said plurality of cavities (13) opening into a plurality of corresponding openings (14) located on at least one edge (19) of the metal substrate (10), each of said plurality of openings (14) is being coupled with s span of a pipe (17) for said heat-carrying fluid, forming a heat transfer area extending upward into said heat transfer area medium.

5. A printed circuit board according to claim 4, characterized in that each of said plurality of cavities (13) has a blind end (16) and an open end having opening (14) on one of said edges (19) of said metal substrate (10) in which said span of pipe (17) is coupled at a proximal end, said span of pipe (17) further having a blind distal end (18), said cavity (13) and said span of pipe (17) assembly forming a heat pipe in which said cavity (13) performs the functions of an evaporation region (21) inside of the substrate (10) and said span of pipe (17) performs the functions of a condensation region (22) in contact with an external heat transfer medium comprising circulating air.

6. A printed circuit board according to claim 5, characterized in that said openings (14) further comprise a countersink opening (15) for receiving said proximal ends of said respective spans of pipe (17).

7. A printed circuit board according to claims 1 or 5, characterized in that said cavities (13) have a circular cross section.

8. A printed circuit board according to claims 1 or 5, characterized in that said cavities (13) have a polygonal cross section.

9. A printed circuit board according to claim 3, characterized in that said plurality of cavities (13) are parallel to each other and have a longitudinal opening along substantially the entire length of each of said plurality of cavities (13) opening onto a side of the metal substrate (10) that is opposite the side thereof on which said electrically insulating layer (11) and electro-conducting tracks (12) are fixed, such that the metal substrate (10) has a cross section shape that is suitable for easily being obtained by extrusion.

10. A printed circuit board according to claim 3 or 5, characterized in that said metal substrate (10) is formed by two layers (10a, 10b) joined together, said cavities (13) being formed by the juxta position of two semi-cavities (13a, 13b) formed respectively on each one of the layers (10a, 10b) of metal substrate (10).

* * * * *